(12) United States Patent
Goruganthu et al.

(10) Patent No.: US 6,430,728 B1
(45) Date of Patent: *Aug. 6, 2002

(54) ACOUSTIC 3D ANALYSIS OF CIRCUIT STRUCTURES

(75) Inventors: Rama R. Goruganthu; Jeffrey D. Birdsley; Michael R. Bruce; Brennan V. Davis; Rosalinda M. Ring, all of Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/410,147

(22) Filed: Sep. 30, 1999

(51) Int. Cl.$^7$ .......................... G06F 17/50; G06F 19/00; G01R 31/26; G10K 11/04; G10K 15/10

(52) U.S. Cl. ............................ 716/4; 700/110; 702/59; 702/103; 702/118; 324/520; 324/765

(58) Field of Search ................. 716/1–21; 700/108–110; 702/54, 58–59, 103, 117, 118; 324/512, 520, 537, 765

(56) References Cited

U.S. PATENT DOCUMENTS

| | | | |
|---|---|---|---|
| 4,618,934 A | * 10/1986 | Nagase | 382/149 |
| 4,831,565 A | * 5/1989 | Woodward | 702/103 |
| 5,101,162 A | * 3/1992 | Webster et al. | 324/618 |
| 5,608,526 A | 3/1997 | Piwonka-Corle et al. | 356/369 |
| 5,633,747 A | 5/1997 | Nikoonahad | 359/312 |
| 5,719,495 A | * 2/1998 | Moslehi | 324/158.1 |
| 5,760,904 A | * 6/1998 | Lorraine et al. | 356/360 |
| 5,771,094 A | 6/1998 | Carter et al. | 356/326 |
| 5,796,004 A | * 8/1998 | Nakaso et al. | 73/643 |
| 5,840,023 A | 11/1998 | Oraevsky et al. | 600/407 |
| 6,182,510 B1 | * 2/2001 | Stanke et al. | 73/597 |
| 6,253,621 B1 | * 7/2001 | Jarvis | 73/665 |
| 6,301,967 B1 | * 10/2001 | Donskoy et al. | 73/579 |

OTHER PUBLICATIONS

NB84124370 ("Detection of Circuit Board Via Defects by Acousto–Electric (Micro–Phonic) Means", IBM Technical Disclosure Bulletin, vol. 27, No. 7B, Dec. 1984, pp. 4370–4372 (4 pages)).*

Deletage et al. ("Thermomechanical behavior of ceramic ball grid array based on experiments and FEM simulations", Nineteenth IEEE/CPMT Electronics Manufacturing Technology Symposium, Oct. 14, 1996, pp. 91–98).*

Semmens et al. ("Nondestructive evaluation of debonding within plastic integrated circuit packages using different methods of acoustic microscopy", 7th IEEE/CHMT International Electronic Manufacturing Technology Symposium, Sep. 25, 1989, p. 322).*

NN87024105 ("Non–Destructive, Non–Contacting Test of Si Wafers by Thermore–Flectance", IBM Technical Disclosure Bulletin, vol. 29, No. 9, Feb. 1987, pp. 4105–4113 (14 pages).*

A. Grossman et al., "A new millimeter free electron laser using a relativistic beam with spiraling electrons," Phys. Fluids 26(1), Jan. 1983, 1983 American Institute of Physics, pp. 337–343.

S.T. Zavtrak, "Free gas bubbles acoustic laser," The Institute of Nuclear Problems, Bobruiskaya Str., 11, Minsk 220050, Belarus, 1995 Elsevier Science B.V., A358(1995) pp. 473–474.

* cited by examiner

Primary Examiner—Matthew Smith
Assistant Examiner—Phallaka Kik

(57) ABSTRACT

According to an example embodiment, the present invention is directed to a system and method for analyzing an integrated circuit. A laser is directed to the back side of an integrated circuit and causes local heating, which generates acoustic energy in the circuit. The acoustic energy propagation in the integrated circuit is detected via at least two detectors. Using the detected acoustic energy from the detectors, at least one circuit defect is detected and located.

22 Claims, 3 Drawing Sheets

ACOUSTIC 3D ANALYSIS OF CIRCUIT STRUCTURES

RELATED APPLICATIONS

The present invention is related to U.S. patent application Ser. No. 09/409,498 entitled "DEFECT DETECTION VIA ACOUSTIC ANALYSIS" and filed on Sep. 30, 1999, and to U.S. patent application Ser. No. 09/387,182, now U.S. Pat. No. 6,253,621, issued Jul. 3, 2001, entitled "MICRO-VOID DETECTION" which are incorporated herein by reference.

FIELD OF THE INVENTION

The present invention relates generally to semiconductor devices and their fabrication and, more particularly, to semiconductor devices and their manufacture involving analyzing the devices for defects.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors operating at speeds of hundreds of millions of instructions per second to be packaged in relatively small, air-cooled semiconductor device packages. A by-product of such high-density and high functionality has been an increase in the number and complexity of the manufacturing processes, as well as an increase in the difficulties of maintaining satisfactory levels of quality control, analyzing the devices for defects, and providing a cost-effective product using such processes.

As the manufacturing processes for semiconductor devices and integrated circuits increase in difficulty, methods for analyzing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

Traditionally, integrated circuits have been tested using methods including directly accessing circuitry or devices within the integrated circuit. In addition, many methods require the circuit to be powered. Directly accessing the circuitry is difficult for several reasons. For instance, in flip-chip type dies, transistors and other circuitry are located in a very thin epitaxially-grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for analyzing, modification, or other purposes. Therefore, access to the transistors and circuitry near the circuit side is from the back side of the chip.

When accessing the transistors and circuitry in flip-chips and other integrated circuits from the back side of the device, it is often necessary to mill through the back side and probe certain circuit elements in order to test the device. Milling through the back side is often difficult and time consuming. Moreover, circuitry and devices in the integrated circuit may potentially be damaged by milling processes. The difficulty, cost, and destructive aspects of existing methods for analyzing integrated circuits are impediments to the growth and improvement of semiconductor technologies.

SUMMARY OF THE INVENTION

The present invention is exemplified in a number of implementations and applications, some of which are summarized below. According to an example embodiment, the present invention is directed to a method for analyzing an integrated circuit. Acoustic energy propagation in the integrated circuit is detected via two or more detectors. The acoustic energy propagation changes with variations in the acoustic impedance of the device, such as variations in acoustic impedance resulting from defects in the device. Using the detected acoustic energy, circuit defects are detected and located.

According to another example embodiment of the present invention, a system is arranged for analyzing an integrated circuit having circuitry in a circuit side opposite a back side. The system includes a substrate removal device arranged to remove substrate from the back side of the device and form an exposed region. A laser is configured and arranged to generate acoustic energy in the integrated circuit. Two or more acoustic energy detectors are coupled to the device and detect the acoustic energy. Using the detected acoustic energy, a computer generates a parameter that can be used to locate defects in the integrated circuit.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
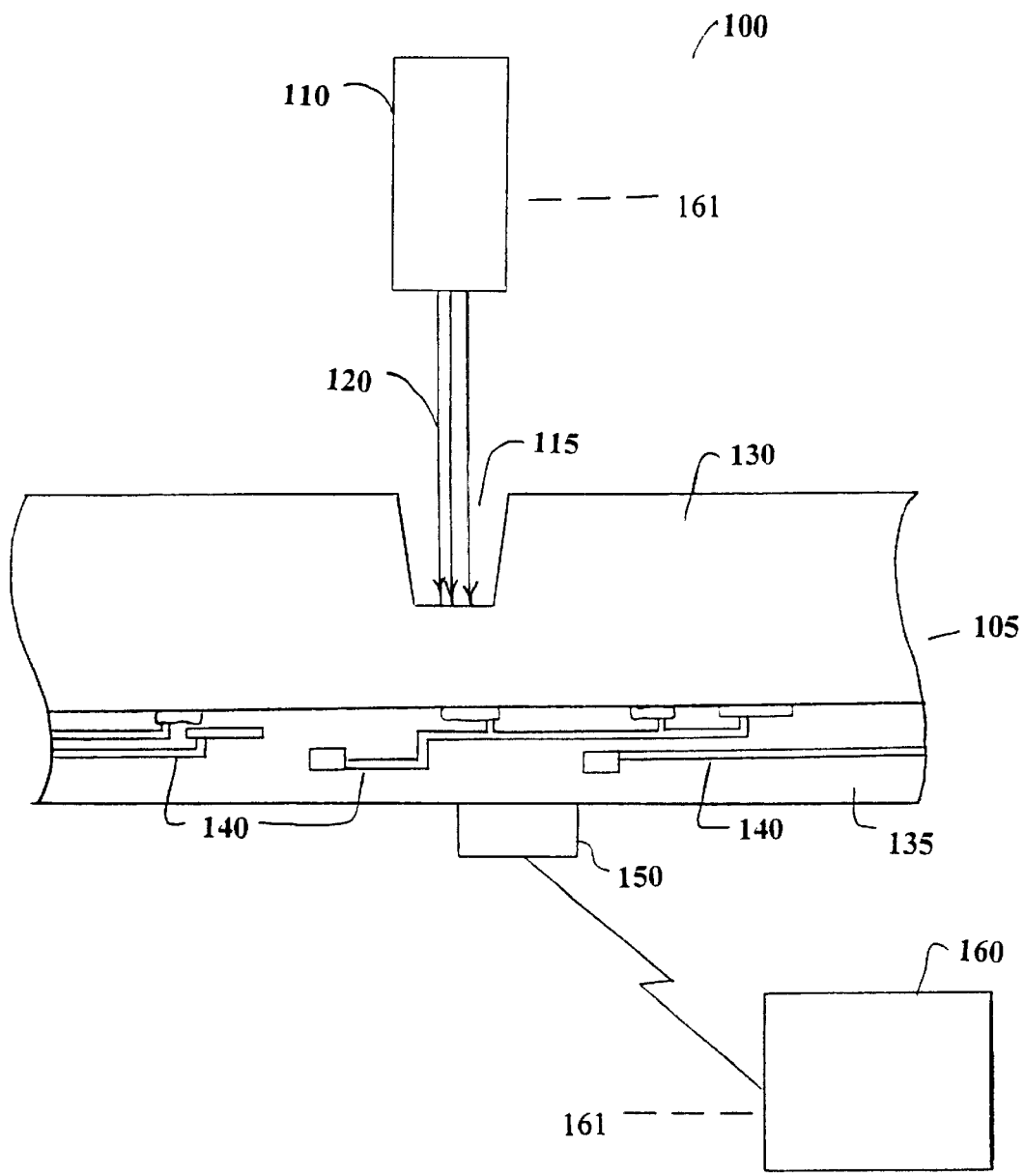
FIG. 1 shows an integrated circuit device undergoing analysis, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices requiring or benefiting from defect analysis. The invention has been found to be particularly suited for identifying and locating defects during post-manufacturing failure analysis of semiconductor devices having target circuitry containing defects such as shorts and opens in the circuit structure. While the present invention is not necessarily limited to such devices, various aspects of the invention may be appreciated through a discussion of various examples using this context.

According to an example embodiment of the present invention, acoustic energy is generated at a location in an integrated circuit device using an energy source, such as a pulsed laser. The energy propagates through the device and is detected using two or more detectors. The frequency spectrum having phase, amplitude, and frequency characteristics for the acoustic energy is detected at each of the detectors. The distance from each detector to the defect is determined via the detected acoustic energy. In this manner, the detected acoustic energy propagation is used to determine the location of defects in the integrated circuit without necessarily directly accessing the circuitry and without necessarily removing substrate from the integrated circuit device.

According to a more particular example embodiment, and referring to FIG. 1, a system 100 for analyzing an integrated circuit 105 having a back side 130 opposite circuitry 140 in a circuit side 135 is shown. A portion 115 of the back side 130 of the integrated circuit 105 is thinned to about 400 microns. The thinning may be accomplished, for example, using a laser, a focused ion beam (FIB), or chemical-mechanical polishing. A laser device 110 directs a laser beam 120 at the thinned portion 115 of the back side 130. In one particular example embodiment, the laser beam has a wavelength of about 1064 or 1320 nanometers, and a pulse width of about 0.1–100 nanoseconds. The laser pulse generates acoustic energy that propagates through the device. The laser pulse can, for instance, generate acoustic energy via local heating by exciting the acoustic modes in silicon. In another instance, the laser generates electron hole pairs that diffuse and recombine, thereby transferring energy to different modes of lattice vibrations. The propagation of the energy of the acoustic pulse changes when it encounters differences in acoustic impedance. The acoustic energy is detected via at least two detectors 150 and 151, and used for defect analysis. The detectors 150 and 151 may include, for example, acoustic transducers such as ultrasonic transducers made by Sonix, Inc., 8700 Morrissette Drive, Springfield, Va. 22152. The detected acoustic energy is used to generate a parameter and a defect is detected at a computer arrangement 160.

In another example embodiment of the present invention, the laser device 110, the detectors 150 and 151, and the computer arrangement 160 are all communicatively coupled via the addition of coupling 161. In addition, the computer arrangement 160 can be configured and arranged to control the laser device 110. The detected acoustic energy can also be used for controlling the laser device 110.

Figure 2:
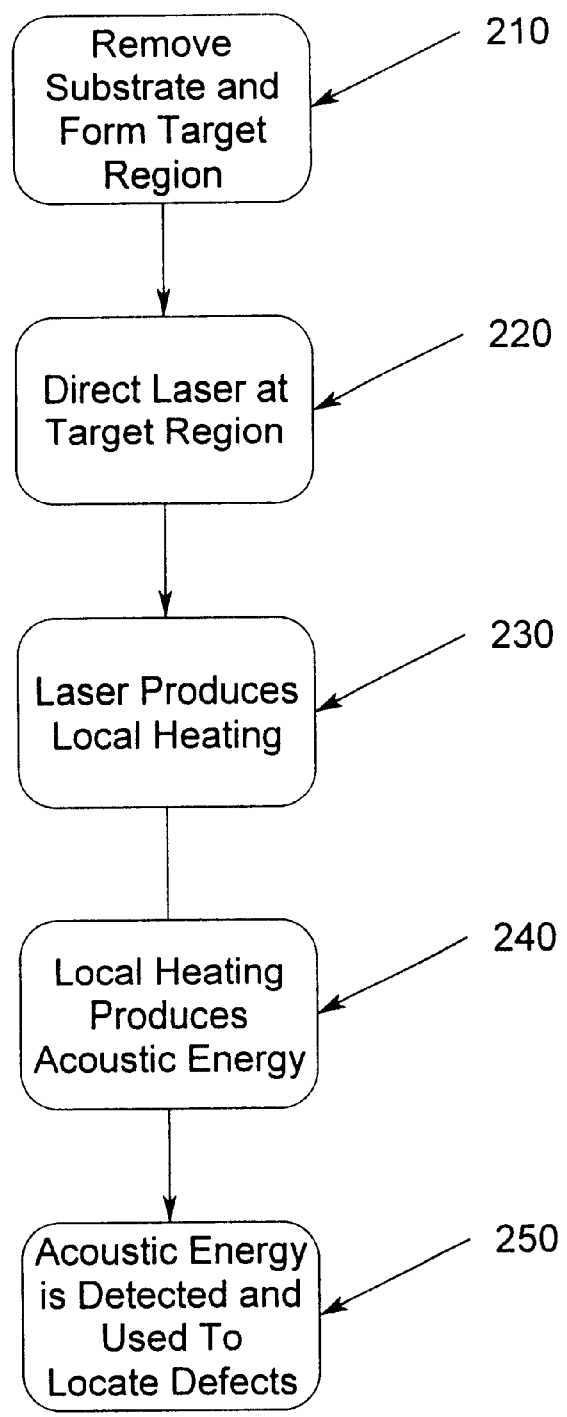
FIG. 2 is a flow diagram for a method of analyzing an integrated circuit device, according to another example embodiment of the present invention.

According to another example embodiment of the present invention, a method for analyzing an integrated circuit is shown in the flow diagram of FIG. 2. Substrate is removed from a target region of an integrated circuit at block 210. A laser is directed at the target region at block 220, and local heating is created at block 230. At block 240, acoustic energy is produced and is detected at block 250, and defects are located.

According to another example embodiment of the present invention, a non-defective integrated circuit can be used to develop a standard reference acoustic pulse propagation for a particular configuration of acoustic detectors. The non-defective integrated circuit device is thinned, an exposed region is formed, and a laser pulse is directed at the exposed region. The laser pulse generates an acoustic pulse in the device that is recorded as a standard reference for a particular configuration of detectors. Aspects of the acoustic pulse, such as the amplitude, frequency, or phase relative to the laser pulse are used for analysis of defective devices.

For example, an acoustic waveform can be detected from a defective integrated circuit device having the same particular configuration of acoustic detectors as used when developing the standard reference acoustic pulse. Using a characteristic of the acoustic waveform as a standard for comparison, such as the recorded phase of the non-defective die, the recorded phase from the integrated circuit device under test can be used to determine the location of defects. The phase of the acoustic pulse for the device under test is obtained by first thinning the device and forming an exposed region at a predetermined thickness that corresponds to the substrate thickness used in establishing the parameter from the non-defective integrated circuit. By thinning the substrate to the predetermined thickness, a laser incident upon the exposed region of the device under test can be applied in a similar manner to the application of the laser to the non-defective device when the standard parameter was determined. A laser pulse is directed at the exposed region of the device under test, and acoustic energy is generated in the device. The phase of the acoustic energy propagation in the device varies when the exposed region includes a defect. The application of the laser is synchronized with the detectors, and the phase detected at each detector is recorded and compared to the standard phase. The difference in phase, or phase shift, is used to determine the location of such defects.

In another example embodiment, the circuit layout of an integrated circuit device is used to target a region for analysis in the device. Substrate is removed from the back side of the device and the target region is exposed. A CAD database is used for navigating across the die, and a laser pulse is vectored to the target region and causes acoustic energy propagation in the device. Defective regions in the device, such as open or short circuits, alter the acoustic resistance of the circuitry containing the defects. The acoustic resistance affects parameters of the acoustic propagation in the device, such as the amplitude, frequency, and phase. Characteristics including the phase of the acoustic propagation are acquired using two or more detectors and used to determine the distance to a defect from each detector. Using this information, the location of the defect in the device is determined, such as via triangulation. This method of detecting defects includes additional advantages in that it does not necessarily require the device to be powered, nor does it necessarily require direct access to circuitry within the device. Moreover, if the device is accessed using a substrate removal process, the acoustic energy can be used to control the substrate removal process.

In addition to comparing the phase of defective and non-defective chips, the type of defect can be determined, according to another example embodiment of the present invention. For example, devices having a short circuit generally exhibit a lower frequency and amplitude acoustic energy wave than similar devices not having a short circuit. This is due to the increased amount of circuitry that is coupled via the short. By comparing the frequency of a non-defective device with a device under test, short circuits can be detected. Conversely, opens in devices reduce the amount of circuitry that is normally coupled in a non-defective circuit. Devices having opens thus exhibit a higher frequency and amplitude acoustic energy wave than a non-defective circuit. By comparing frequencies and amplitudes in this manner, opens circuits can be detected.

In the above example embodiments, pulsing the laser can be accomplished by turning the laser on and off or by otherwise varying the laser's intensity. Typical commercially-available Q-switched lasers can be used to generate the pulse. By pulsing the laser, the amount of energy transferred to or induced in the device can be controlled. For example, as compared to using and applying a laser having a constant intensity over an uninterrupted period of time, pulsing the laser reduces the amount of energy transferred by the laser to the device. This method is particularly advantageous for exciting circuitry within the device and holding that circuitry at a particular energy level or level of activation, which is useful for analyzing the device. For instance, pulsing the laser can be used to maintain devices, such as pn junctions, near their operating voltage. In this manner, the devices can be easily pushed to their operating voltage, and turned on. Pulsing the laser also reduces the risk of overheating the device and melting metal in the device.

Figure 3:
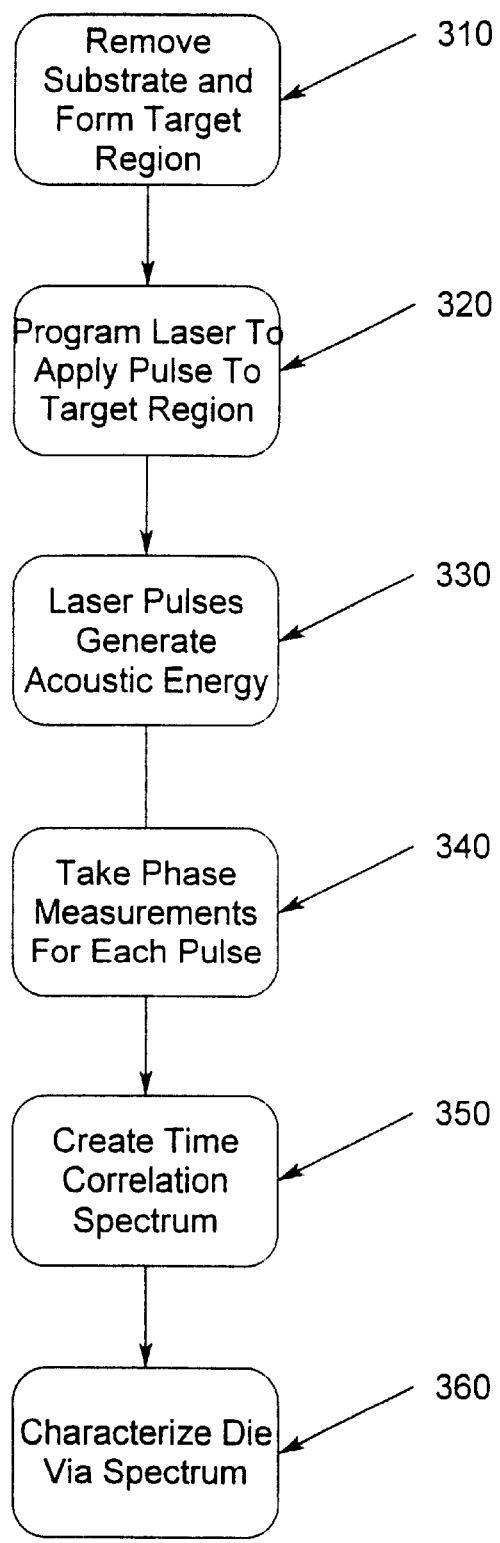
FIG. 3 is a flow diagram for another method of analyzing an integrated circuit device, according to another example embodiment of the present invention.

In another example embodiment of the present invention, and according to FIG. 3, substrate is removed from the back side of an integrated circuit die and a target region is formed at block 310. The laser is directed at the target region and is programmed to pulse several times at block 320. At block 330, the laser pulses generate acoustic energy. A series of phase measurements are made for each pulse via two or more detectors at block 340, and a time correlation spectrum is created at block 350. Using the time correlation spectrum, the die is characterized at block 360. For example, the sequence of measurements can be made for different frequencies and used to detect characteristics and comparisons for the die. Obtaining measurements at different frequencies is useful because the damping of the acoustic wave as additional mass is added due to a short, or as mass is removed due to an open, is also a function of the frequency. Therefore, variations in frequency from a standard may indicate the existence of a short or an open in the circuitry.

In still another example embodiment of the present invention, the wavelength of the laser is chosen to more effectively couple acoustic energy to a desired portion of circuitry in an integrated circuit device to be tested, based upon the thickness of substrate through which the laser must pass to reach the circuitry. The thickness of substrate that the laser must travel through affects the energy deposition in the device because the thicker substrate restricts the penetration of the laser beam. However, laser beams of dissimilar wavelength penetrate the substrate differently, as depicted by the following equation:

$$I(x) = I_o \times e^{-\alpha x}, \text{ wherein} \quad \text{Equation 1:}$$

I(x)=the intensity of the light at a distance x into the substrate;
$I_o$=the intensity of light entering the substrate;
x.=the distance into the substrate; and
α=the wavelength-dependent absorption coefficient of the substrate.

Therefore, varying the laser beam wavelength permits the use of a laser incident upon a target region in a particular integrated circuit die to couple acoustic energy to portions of the die at different depths in the substrate. For example, the depth that a laser having a particular wavelength will penetrate can be determined by measuring the transmission coefficient for light to pass through a known thickness of substrate.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing an integrated circuit, wherein the circuit has circuitry in a circuit side opposite a back side, the method comprising:

removing substrate from the back side and exposing a target region;

directing a laser at the target region and generating local heating in the integrated circuit;

detecting acoustic energy propagation in the integrated circuit via at least two acoustic energy detectors;

using the detected acoustic energy at each acoustic energy detector to generate parameters; and using the acoustic energy detected at each detector to locate at least one defect in the circuit as a function of the parameters.

2. A method for analyzing an integrated circuit, according to claim 1, further comprising controlling the substrate removal process responsive to the detected acoustic energy.

3. A method for analyzing an integrated circuit, according to claim 1, wherein directing a laser at the target region in the back side of the integrated circuit includes pulsing the laser.

4. A method for analyzing an integrated circuit, according to claim 3, further comprising maintaining pn junctions near their operating voltage.

5. A method for analyzing an integrated circuit, according to claim 1, wherein the laser is synchronized with the at least two acoustic energy detectors, and wherein locating at least one defect includes detecting a phase shift of the detected acoustic energy at each acoustic energy detector.

6. A method for analyzing an integrated circuit, according to claim 1, wherein using the detected acoustic energy at each acoustic energy detector to generate parameters ineludes using a computer arrangement.

7. A method for analyzing an integrated circuit, according to claim 1, wherein locating at least one defect in the circuit as a function of the parameters includes locating at least one of: an open circuit and a short circuit.

8. A method for analyzing an integrated circuit, according to claim 7, wherein locating at least one defect in the circuit as a function of the parameters includes comparing the parameters to at least one standard parameter for a non-defective integrated circuit.

9. A method for analyzing an integrated circuit, according to claim 8, wherein detecting acoustic energy propagation in the integrated circuit having a lower frequency and amplitude than the standard parameter indicates a short circuit.

10. A method for analyzing an integrated circuit, according to claim 8, wherein detecting an acoustic energy propagation in the integrated circuit having a higher frequency and amplitude than the standard parameter indicates an open circuit.

11. A method for analyzing an integrated circuit, according to claim 8, wherein removing substrate from the back side and exposing a target region includes removing an amount of substrate that corresponds to an amount of substrate removed from the non-defective integrated circuit when the at least one standard parameter was ascertained.

12. A method for analyzing an integrated circuit, according to claim 1, wherein the integrated circuit is not powered.

13. A method for analyzing an integrated circuit, according to claim 1, further comprising:

pulsing the laser several times; and making a series of phase measurements for each pulse via the at least two detectors.

14. A method for analyzing an integrated circuit, according to claim 13, wherein making a series of phase measurements includes making measurements for different frequencies.

15. A method for analyzing an integrated circuit, according to claim 1, further comprising adjusting the wavelength of the laser and directing acoustic energy to target circuitry.

16. A method for analyzing an integrated circuit, according to claim 15, wherein the target circuitry is located at a depth into the substrate, and wherein the wavelength is adjusted to direct energy at that depth.

17. A system for analyzing an integrated circuit having circuitry in a circuit side opposite a back side, the system comprising:

means for removing substrate from the back side;

a laser device adapted to generate acoustic energy in the integrated circuit, affecting circuit activity means for detecting acoustic energy propagation in the integrated circuit via at least two locations;

means for using the detected acoustic energy propagation to generate a parameter; and means for detecting at least one defect in the circuit based on the geterated parameter.

18. A system for analyzing an integrated circuit having circuitry in a circuit side opposite a back side, the system comprising:

a substrate removal device;

a laser configured and arranged to generate acoustic energy in the integrated circuit affecting circuit activity;

at least two acoustic energy detectors to detect acoustic energy in the integrated circuit; and a computer configured and arranged to use detected acoustic energy and generate a parameter that is used to locate at least one defect in the integrated circuit.

19. A system for analyzing an integrated circuit, according to claim 18, wherein the laser, the at least two acoustic energy detectors, and the computer are communicatively coupled.

20. A system for analyzing an integrated circuit, according to claim 19, wherein the computer is configured and arranged to control the laser.

21. A system for analyzing an integrated circuit, according to claim 18, wherein the computer is further configured and arranged to locate at least one defect in the integrated circuit using the detected acoustic energy.

22. A system for analyzing an integrated circuit, according to claim 21, wherein the computer is configured and arranged to detect at least one of: a short circuit and an open circuit.

* * * * *

UNITED STATES PATENT AND TRADEMARK OFFICE
CERTIFICATE OF CORRECTION

PATENT NO.     : 6,430,728 B1
DATED          : August 6, 2002
INVENTOR(S)    : Goruganthu et al.

It is certified that error appears in the above-identified patent and that said Letters Patent is hereby corrected as shown below:

Column 6,
Line 39, "ineludes" should read -- includes --.

Signed and Sealed this

Eleventh Day of February, 2003

JAMES E. ROGAN
*Director of the United States Patent and Trademark Office*